(12) United States Patent
Wang et al.

(10) Patent No.: US 11,532,843 B2
(45) Date of Patent: Dec. 20, 2022

(54) DETECTION METHOD AND DETECTION DEVICE FOR BRANCH STATES OF BATTERY SYSTEM

(71) Applicant: CALB Co., Ltd., Jiangsu (CN)

(72) Inventors: Guanjun Wang, Luoyang (CN); Chaofan Lv, Luoyang (CN)

(73) Assignee: CALB Co., Ltd., Jiangsu (CN)

( * ) Notice: Subject to any disclaimer, the term of this patent is extended or adjusted under 35 U.S.C. 154(b) by 238 days.

(21) Appl. No.: 17/010,834

(22) Filed: Sep. 3, 2020

(65) Prior Publication Data

US 2021/0296713 A1 Sep. 23, 2021

(30) Foreign Application Priority Data

Mar. 20, 2020 (CN) .......................... 202010200021.3

(51) Int. Cl.
  *H01M 10/48* (2006.01)
  *G01R 31/396* (2019.01)
  *G01R 31/3835* (2019.01)
  *H01M 10/42* (2006.01)

(52) U.S. Cl.
  CPC ...... *H01M 10/482* (2013.01); *G01R 31/3835* (2019.01); *G01R 31/396* (2019.01); *H01M 10/4207* (2013.01); *H01M 10/4257* (2013.01); *H01M 2010/4271* (2013.01)

(58) Field of Classification Search
  CPC .. G01R 31/3835; G01R 31/396; G01R 31/54; H01M 10/4207; H01M 10/4257; H01M 10/482; H01M 2010/4271; Y02E 60/10
  See application file for complete search history.

(56) References Cited

U.S. PATENT DOCUMENTS

2011/0298626 A1  12/2011  Fechalos et al.
2013/0163135 A1   6/2013  Liebhard

FOREIGN PATENT DOCUMENTS

| CN | 104678153 | 6/2015 |
| CN | 105553391 | 5/2016 |
| CN | 109782193 | 5/2019 |

(Continued)

OTHER PUBLICATIONS

Machine Translation CN109782193A (Year: 2019).*

(Continued)

*Primary Examiner* — Victoria H Lynch
(74) *Attorney, Agent, or Firm* — JCIP Global Inc.

(57) ABSTRACT

A detection method and a detection device for branch states of a battery system are provided. A current on/off state of each branch is judged according to a first open circuit voltage of the corresponding branch and a second open circuit voltage corresponding to the battery system. Time for detecting and diagnosing each branch state can be reduced. It solves that the problem of longer time consumption and large error caused by the determination of the status of each branch through the change of the voltage of each branch in the prior art. A detection efficiency of branch states and an accuracy of detection results of branch states are both improved. The detection method is simple and quick to operate, and will not cause the complexity to increase rapidly as the number of branches increases. The detection method has good feasibility and practicability, and has a wide range of applications.

18 Claims, 7 Drawing Sheets

(56) References Cited

FOREIGN PATENT DOCUMENTS

| | | |
|---|---|---|
| CN | 109901004 | 6/2019 |
| CN | 110506215 | 11/2019 |
| CN | 110854965 | 2/2020 |

OTHER PUBLICATIONS

Office Action of China Counterpart Application, with English translation thereof, dated Sep. 24, 2021, pp. 1-13.
"Office Action of China Counterpart Application", with English translation thereof, dated Mar. 3, 2022, p. 1-p. 16.
"Search Report of Europe Counterpart Application", dated Feb. 22, 2021, pp. 1-7.
Office Action of China Counterpart Application, with English translation thereof, dated Jun. 17, 2022, pp. 1-13.

* cited by examiner

DETECTION METHOD AND DETECTION DEVICE FOR BRANCH STATES OF BATTERY SYSTEM

CROSS-REFERENCE TO RELATED APPLICATION

This application claims the priority benefit of China application serial no. 202010200021.3, filed on Mar. 20, 2020. The entirety of the above-mentioned patent application is hereby incorporated by reference herein and made a part of this specification.

TECHNICAL FIELD

The disclosure relates to the technical field of battery detection, and more particularly, to a detection method and a detection device for branch states of a battery system.

BACKGROUND

With the development of new energy technology, taking new energy vehicles as an example, the demand for the capacity of the battery system continues to increase. The battery system needs to provide stable, durable, and large-capacity electrical energy to ensure the normal use of the vehicle.

The battery system generally includes a plurality of batteries, and the battery system may include a plurality of branches. Each of the branches may include multiple batteries connected in series. Regarding the connection between the batteries in this kind of the battery system, a plurality of batteries may be connected in series to form a branch and then the branches are connected in parallel.

For the connection method of serial to parallel, when one of the branches occurs fault (e.g., an open circuit occurs fault), the load of the branch where the open circuit fault occurs needs to be borne by other branches. Consequently, non-faulty branches are prone to overloading which causes potential safety hazards. Therefore, how to detect and diagnose each branch state to ensure that the non-faulty branches are not damaged, ensure the safety of the battery system and eliminate potential safety hazards is a technical problem that needs to be solved by those skilled in the art.

SUMMARY

In a first aspect, an embodiment of the disclosure provides a detection method for branch states of a battery system. The battery system includes a plurality of branches connected in parallel, and each of the branches includes at least one battery. The detection method includes:

obtaining a first open circuit voltage corresponding to each of the branches and a second open circuit voltage corresponding to the battery system;

judging a current on/off state of each corresponding branch according to the first open circuit voltage and the second open circuit voltage.

In a second aspect, an embodiment of the disclosure provides a detection device for branch states of a battery system. The battery system includes a plurality of branches connected in parallel, and each of the branches includes at least one battery. The detection device includes:

a first module, configured to obtain a first open circuit voltage corresponding to each of the branches and a second open circuit voltage corresponding to the battery system;

a second module, configured to judge a current on/off state of each corresponding branch according to the first open circuit voltage and the second open circuit voltage.

In a third aspect, an embodiment of the disclosure provides a battery system including a plurality of branches connect in parallel.

Here, on/off states of the braches are detected by adopting the detection method provided in the foregoing embodiments of the disclosure.

BRIEF DESCRIPTION OF THE DRAWINGS

So as to emphasize and clearly illustrate the features described herein. In addition, related elements or components can be variously arranged, as known in the art. Further, in the drawings, like reference numerals designate corresponding parts throughout the several views.

DESCRIPTION OF THE EMBODIMENTS

The specific implementation of a detection method and a detection device for branch states of a battery system provided by the embodiments of the disclosure will be described in detail below in conjunction with the accompanying drawings. It should be noted that, the described embodiments are only a part of the embodiments of the disclosure rather than all the embodiments. Based on the embodiments of the disclosure, all other embodiments obtained by those of ordinary skill in the art without making creative efforts fall within the protection scope of the disclosure.

Embodiments of the disclosure provides a detection method and a detection device for branch states of a battery system, configured to detect and diagnose each branch state to ensure that the non-faulty branches are not damaged, ensure the safety of the battery system and eliminate potential safety hazards.

Figure 2:
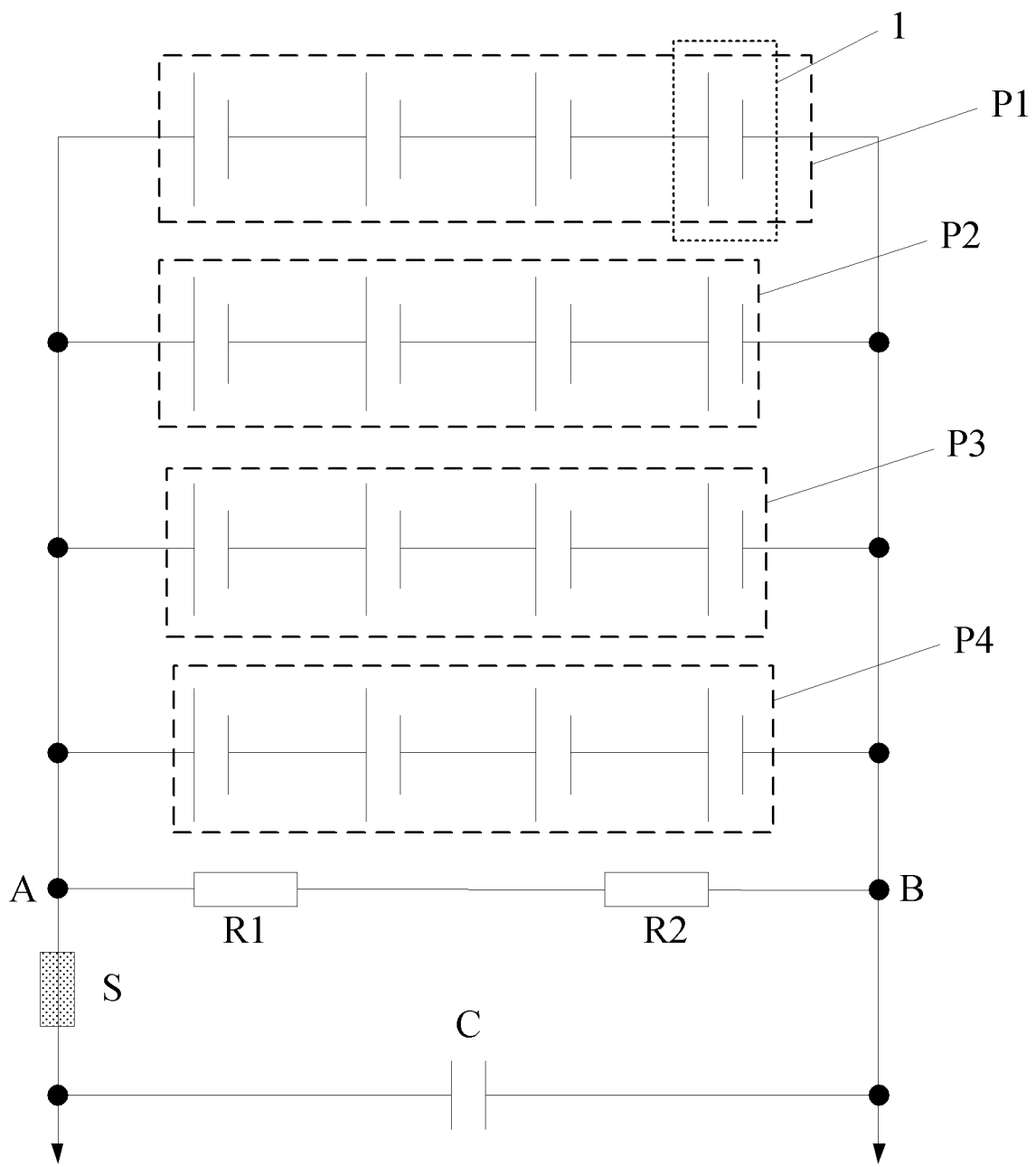
FIG. 2 is a schematic structural diagram of a battery system provided in an embodiment of the disclosure.

The present embodiment of the disclosure provides a detection method for branch states of a battery system. The battery system includes a plurality of branches connected in parallel, and each of the branches includes at least one battery. Here, when the branch includes a plurality of batteries, the batteries may be configured to be in a serial connection (as shown in FIG. 2), a parallel connection (not shown), or a combination of serial and parallel connections (as shown by P6 in FIG. 6), so as to meet the needs of different application scenarios and improve a design flexibility.

Figure 1:
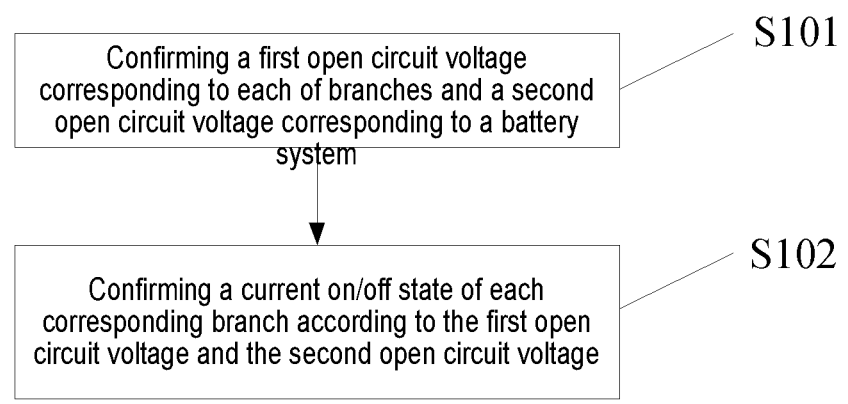
FIG. 1 is a flowchart of a detection method provided in an embodiment of the disclosure.

As shown by FIG. 1, the detection method includes:

S101: obtaining a first open circuit voltage corresponding to each of the branches and a second open circuit voltage corresponding to the battery system.

Here, with the branch having the batteries connected in series taken as an example, the first open circuit voltage may be: a sum of voltages provided by the batteries included in the branch. It is noted that the first open circuit voltage and the second open circuit voltage can be obtained through detection or calculation, which is not limited in the present disclosure.

Optionally, when the second open circuit voltage corresponding to the battery system is to be confirmed, the second open circuit voltage corresponding to the battery system may be collected according to a preset first collection period. The first collection period may be set as needed, and is not specifically limited here.

The structure of the battery system may be as shown in FIG. 2, which shows that the battery system includes 4 branches, labeled as a branch 1 (e.g., P1), a branch 2 (e.g., P2), a branch 3 (e.g., P3) and a branch 4 (e.g., P4). Each branch includes four batteries (e.g., 1) connected in series. Naturally, in actual situations, the number of batteries included in each branch and the number of branches included in the battery system are not limited to those shown in FIG. 2. Here, FIG. 2 is merely used as an example. The number of batteries included in each branch and the number of branches included in the battery system can be arbitrarily set according to actual needs, to meet the needs of different application scenarios and improve the design flexibility.

Referring to FIG. 2, taking the branch 1 as an example, the first open circuit voltage corresponding to the branch 1 can be understood as an accumulation of real time voltages provided by the four batteries included in the branch 1 (P1) at the respective collection time.

The second open circuit voltage can be understood as a voltage difference between points A and B in FIG. 2.

Further, in FIG. 2, two resistors are further disposed and labeled R1 and R2, respectively. These two resistors are used to measure the voltage difference between the points A and B, that is, to measure the second open circuit voltage. Meanwhile, in FIG. 2, a capacitor C is also provided. The capacitor C can be understood as an external equivalent capacitance of the battery system.

S102: judging a current on/off state of each corresponding branch according to the first open circuit voltage and the second open circuit voltage.

Here, the on/off state of the branch includes an off state and a (normal) on state. The off state can be understood as the branch being open-circuited, which makes the branch unable to output current and voltage to the outside; the on state can be understood as a normal state, in which current and voltage can be outputted to the outside normally.

Accordingly, in the present embodiment of the disclosure, the current on/off state of each corresponding branch is judged according to the first open circuit voltage of the corresponding branch and the second open circuit voltage corresponding to the battery system. The time for detecting and diagnosing each branch state can be reduced to solve the problem of longer time consumption and large error caused by voltage changes of each branch in the prior art when confirming each branch state. Accordingly, a detection efficiency of branch states and an accuracy of detection results of branch states are both improved.

Moreover, the detection method provided according to the present embodiment of the disclosure is simple and quick to operate, and the detection method will not cause the complexity to increase rapidly as the number of branches increases. Therefore, the detection method provided according to the present embodiment of the disclosure has good feasibility and practicability, and has a wide range of applications.

Optionally, in the present embodiment of the disclosure, on/off states of the branches are confirmed in sequence.

For example, referring to FIG. 2, for the branch 1 to the branch 4, a confirming order for the on/off states may be the branch 1 (P1), the branch 2 (P2), the branch 3 (P3) and the branch 4 (P4) in that sequence; nonetheless, the confirming order may also be the branch 1 (P1), the branch 3 (P3), the branch 4 (P4) and the branch 2 (P2) in that sequence. The confirming order can be adjusted according to actual situations, and is not limited here.

Since the on/off states of the branches are confirmed in sequence, a detection time for the on/off states of the branches can be reduced, and the detection efficiency can be improved.

In actual implementation, in the present embodiment of the disclosure, the step of judging the current on/off state of each corresponding branch according to the first open circuit voltage and the second open circuit voltage includes:

for each of the branches, executing a process of:

judging the current on/off state of the corresponding branch according to a calculated difference between the first open circuit voltage of the corresponding branch and the second open circuit voltage.

In this way, through the difference between the first open circuit voltage and the second open circuit voltage, the current on/off state of the corresponding branch can be judged and the on/off state of the corresponding branch can be determined, so as to realize a detection of branch states.

It should be noted that, in the present embodiment of the disclosure, other than judging the current on/off state of the corresponding branch according to the calculated difference between the first open circuit voltage of the corresponding branch and the second open circuit voltage, the current on/off state of the corresponding branch may also be judged according to a ratio between the first open circuit voltage of the corresponding branch and the second open circuit voltage, which is not specifically limited herein. The following descriptions are provided all with the example in which the current on/off state of the corresponding branch is judged according to the calculated difference between the first open circuit voltage of the corresponding branch and the second open circuit voltage.

Optionally, in the present embodiment of the disclosure, the step of judging the current on/off state of the corresponding branch according to the calculated difference between the first open circuit voltage of the corresponding branch and the second open circuit voltage includes:

calculating an average value of the second open circuit voltages collected within a preset first time, and defining the average value as a first average value;

calculating a difference between the first open circuit voltage of the corresponding branch and the first average value, and defining the difference as a first value;

adjusting a second value for indicating a branch on/off state of the corresponding branch according to the first value;

judging the current on/off state of the corresponding branch according to the second value.

Here, the preset first time can be understood as the time used to collect the first open circuit voltage of any of the branches; and each of the branches corresponds to one preset first time. The preset first time corresponding to the different branches may be the same or different, and the preset first time is related to the time required to collect a real time voltage of each battery in the corresponding branch.

Further, within the preset first time, when the second open circuit voltage is being collected, the collection may be performed according to the first collection period. Furthermore, the collected second open circuit voltage may be plural and may be one only, depending on a time length set for the first collection period. If the collected second open circuit voltage is plural, the average value of the second open circuit voltages collected within the preset first time may be calculated and used as the first average value for subsequent use; if the collected second open circuit voltage is one, the collected second open circuit voltage may be directly used as the first average value for subsequent use.

Specifically, in actual implementation, a collection period for collecting the voltage provided by each battery in the branch (a.k.a. a third collection period) may be greater than the first collection period. The third collection period can be set to less than 1 second, so that a plurality of second open circuit voltages may be collected within the preset first time. Accordingly, an average value is calculated according to the plurality of second open circuit voltages. Then, a subsequent calculation is performed according to the average value to improve the stability and reliability of subsequent calculation results, thereby improving the accuracy of the detection results.

In addition, the first value confirmed may be but not limited to an absolute value of a difference between the first open circuit voltage of the corresponding branch and the first average value. In this way, the first value can be a non-negative number, so that the first value can be used to adjust the second value to realize the detection of branch states.

Further, the difference between the first open circuit voltage and the first average value can be understood as:

a value obtained by subtracting the first average value from the first open circuit voltage;

or a value obtained by subtracting the first open circuit voltage from the first average value.

That is to say, taking the difference between A and B as an example, the difference mentioned in the present embodiment of the disclosure may be a value of A minus B or a value of B minus A as long as the difference can be obtained.

In this way, the current on/off state of the corresponding branch may be reflected through the first value (i.e., the difference between the first open circuit voltage and the first average value), so that the on/off state of the corresponding branch can be determined to realize the detection of branch states.

Optionally, in the present embodiment of the disclosure, the step of judging the current on/off state of the corresponding branch according to the second value includes:

confirming that the corresponding branch is currently in the off state when determining that the second value is greater than a preset value.

In other words, whether the second value is currently greater than the preset value is determined;

if so, it is confirmed that the corresponding branch is currently in the off state;

if not, it is confirmed that the corresponding branch is currently in the on state.

For the preset value (denoted by Z), it needs to meet a value of $Z \times (t1-t0)$ being less than or equal to a maximum allowable diagnosis time of the battery system, and meet a necessary fault filtering time. Here, a time difference of t1 and t0 can be understood as the preset first time to avoid affecting the battery system and to ensure the accuracy of the detection results.

In this way, by comparing the second value with the preset value, the current on/off states of the corresponding branch can be determined, so that the detection method becomes simple, fast and efficient, thereby improving the detection efficiency of branch states.

Optionally, in the present embodiment of the disclosure, the step of adjusting the second value for indicating the branch on/off state of the corresponding branch according to the first value includes:

adding one to the second value of the corresponding branch when determining that the first value is not less than a preset first voltage threshold;

or keeping the second value of the corresponding branch unchanged when determining that the first value is less than the preset first voltage threshold and the first value is not less than a preset second voltage threshold, wherein the first voltage value is greater than the second voltage threshold;

or setting the second value of the corresponding branch to zero when determining that the first value is less than the preset second voltage threshold.

Here, in actual situations, the step above can be implemented in the following ways:

determining whether the first value is not less than the first voltage threshold;

if so, adding one to the second value of the corresponding branch;

if not, determining whether the first value is less than the preset second voltage threshold, wherein the first voltage value is greater than the second voltage threshold;

if so, setting to the second value of the corresponding branch to zero;

if not, keeping the second value of the corresponding branch unchanged.

For example, it is assumed that $D1=|Vx1-Va1|$ with the first voltage threshold denoted by Vy1, the second voltage threshold denoted by Vy2, the first value denoted by D1, the first open circuit voltage of the corresponding branch denoted by Vx1; the first average value denoted by Va1 and the second value denoted by D2.

In this case, if $D1=|Vx1-Va1| \geq Vy1$, it means that the difference between the first open circuit voltage of the corresponding branch and the first average value is larger. This also indicates that the difference between the first open circuit voltage of the corresponding branch and the second open circuit voltage is larger since the first average value is calculated according to the second open circuit voltages. In actual situations, if one specific branch is open-circuited, the difference between the first open circuit voltage of that specific branch and the second open circuit voltage will be larger. Therefore, based on the above analysis, it can be known that the branch is very likely to be in the off state at this time, resulting in the larger difference between the first open circuit voltage of the corresponding branch and the second open circuit voltage. Thus, D2 can be added by 1 to indicate that the branch is currently in the off state.

If $D1=|Vx1-Va1|<Vy1$ and $D1=|Vx1-Va1|<Vy2$, it means that the difference between the first open circuit voltage of the corresponding branch and the first average value is smaller. That is, the difference between the first open circuit voltage of the corresponding branch and the second open circuit voltage is smaller. This indicates that the branch is currently in the (normal) on state and less likely to be open-circuited, and thus D2 can be set to zero (i.e., D2=0).

If $Vy1>D1=|Vx1-Va1| \geq Vy2$, it means that the difference between the first open circuit voltage corresponding to the branch and the first average value is not larger nor smaller. In other words, the branch is currently in the (normal) on state but very likely to be open-circuited. A possible reason for this to happen is that voltage and resistance of the battery changed with a long-term use of the battery system will cause the first open circuit voltage of the branch corresponding to fluctuate and be in a unstable state. In this case, D2 can remain unchanged and the detection of the corresponding branch is continued to further confirm the current on/off state of the corresponding branch.

Nevertheless, it is assumed that the step of determining whether the first value is not less than the first voltage threshold is called a first determining process and the step of determining whether the first value is less than the second voltage threshold is called a second determining process.

In this case, the first determining process may be executed first before the second determining process is executed;

or the first determining process and the second determining process may be executed simultaneously.

As long as the second value can be adjusted, an execution order of the first determining process and the second determining process is not specifically limited here.

In this way, with the second value adjusted through the first value, the current on/off state of the corresponding branch can be subsequently confirmed according to the second value. Thus, the detection of branch states is realized, and the detection method becomes simpler, faster and more efficient.

Optionally, in the present embodiment of the disclosure, a working condition state that the battery system is in includes a static working condition and a dynamic working condition;

the first voltage threshold corresponding to the battery system in the static working condition is less than the first voltage threshold corresponding to the battery system in the dynamic working condition;

the second voltage threshold corresponding to the battery system in the static working condition is less than the second voltage threshold corresponding to the battery system in the dynamic working condition;

the second voltage threshold corresponding to the battery system in the dynamic working condition is greater than the first voltage threshold corresponding to the battery system in the static working condition.

Although the working condition state of the battery system includes the static working condition and the dynamic working condition, the detection method for branch states is the same no matter which working condition state that the battery system is in. In this way, the detection of branch states can be greatly simplified, and the problem of more complicated and cumbersome detection method for the different working condition state can be solved, thereby greatly improving the detection efficiency of branch states.

Further, the detection accuracy may be improved for the different working condition state simply by adjusting the first voltage threshold and the second voltage threshold. In other words, since the first voltage threshold and the second voltage threshold corresponding to the different working condition state are different, an accurate detection of branch states can be achieved for the different working condition state to reduce detection errors and improve the accuracy of the detection results.

In addition, optionally, values of the first voltage threshold and the second voltage threshold can be set according to factors such as a size of total currents, battery characteristics, a size of the second open circuit voltages and an accuracy of the first open circuit voltage to meet requirements of the different working condition state and help to improve accuracy of the detection.

It should be noted that, optionally, when the on/off state of each branch is to be detected, the detection may be performed based on a preset detection period. In other words, when the detection period is reached, the first open circuit voltage of the corresponding branch and the second open circuit voltage corresponding to the battery system are collected, and then the current on/off state of the branch is confirmed according to the first open circuit voltage and the second open circuit voltage. In an i-th detection period, if a detection result is that the branch is currently in the off state, it is necessary to continue detecting the on/off state of the branch when an (i+1)-th detection period is reached. Here, the i is a positive integer. With the detection method will be the same to realize a real time detection for the branch, so as to obtain the on/state of each branch in real time and provide an effective reference for protecting the battery system as well as solving and avoiding potential safety hazards.

In actual implementation, in the present embodiment of the disclosure, when the working condition state that the battery system is in includes the static working condition and the dynamic working condition, before confirming the current on/off state of the corresponding branch according to the first open circuit voltage and the second open circuit voltage and after obtaining the first open circuit voltage corresponding to each of the branches and the second open circuit voltage corresponding to the battery system, the detection method further includes:

confirming total currents corresponding to the battery system collected within the preset first time;

judging the working condition state that the battery system is currently in according to the total currents.

Here, the preset first time can be the time used to collect the first open circuit voltage of any of the branches.

Further, when the total currents are being collected, the total currents can be collected based on a preset second collection period. Meanwhile, the first collection period and the second collection period may be set to be the same or different, so as to meet the needs of different application scenarios and improve the design flexibility.

In addition, referring to FIG. 2, the battery system may include a current sensor S. The current sensor S is used to measure the total currents output by the battery system, which can be directly collected and obtained by a battery management system (BMS).

In this way, the working condition state that the battery system is currently in can be judged by the collected total currents. That is, a simple method can be used to judge the working condition state that the battery system is currently in, so as to simplify the detection of branch states and thereby improve the detection efficiency.

Optionally, in the present embodiment of the disclosure, the step of judging the working condition state that the battery system is currently in according to the total currents includes:

calculating an average value of the total currents collected within the preset first time, and defining the average value as a second average value;

judging the working condition state that the battery system is currently in according to the second average value and the total currents.

In this way, the working condition state that the battery system is currently in can be judged according to these two parameter including the total current and the second average value. Therefore, the working condition state that the battery system is currently in may be judged through the collected total currents, so as to simplify the detection of branch states and improve the detection efficiency.

Optionally, in the present embodiment of the disclosure, the step of judging the working condition state that the battery system is currently in according to the second average value and the total current includes:

determining whether the second average value is less than a preset first current threshold and whether the total currents collected are less than a preset second current threshold;

if so, confirming that the battery system is currently in the static working condition;

if not, confirming that the battery system is currently in the dynamic working condition.

Here, the step of determining whether the second average value is less than the preset first current threshold may include:

determining whether an absolute value of the second average value is less than the preset first current threshold.

The step of determining whether the total currents are less than the preset second current threshold may include:

determining whether absolute values of the total currents collected are less than the preset second current threshold.

For example, it is assumed that 6 total currents are collected within the preset first time (including I1, I2, I3, I4, I5, and I6 in that sequence based on a collection order); the second average value is the average value of the 6 total currents and denoted by Ia1; the first current threshold is denoted by Iy1; the second current threshold is denoted by Iy2.

In this case, if |Ia1| is less than Iy1 and |I1|, |I2|, |I3|, |I4|, |I5|, and |I6| are all less than Iy2, since the total currents collected within the preset first time are smaller and relatively stable, the battery system is currently in the static working condition;

when |Ia1| less than Iy1 is used as a first condition and |I1|, |I2|, |I3|, |I4|, |I5| and |I6| all less than Iy2 is used as a second condition, if the first condition and the second condition cannot be satisfied at the same time, since the total currents collected within the preset first time are unstable and fluctuate greatly, the battery system is currently in the dynamic working condition.

The first current threshold can be confirmed according to a measurement error of the current sensor, a collection error of the BMS and a zero drift current of the current sensor when the total current output by the battery system is zero, so as to meet the needs of different application scenarios.

The second current threshold can be understood as a maximum current that does not cause the second open circuit voltage corresponding to the battery system to change, which can be obtained by testing or according to the battery characteristics. The reason for setting the second current threshold in this way is:

the battery system includes structures such as the current sensor, a connector used to realize the connection function, or the like. These structures have a certain impedance, and the impedance can generally be in the mΩ level. When the current is larger, divided voltages occupied by these structures will be larger to have a greater impact on the collected second open circuit voltages.

In order to prevent the second open circuit voltages from the greater impact and to ensure the stability of the collected second open circuit voltages, the second current threshold is set this way to ensure the accuracy of the detection results in the subsequent process.

Accordingly, with the working condition state that the battery system is currently in judged by the collected total currents, the detection of branch states can be simplified to improve the detection efficiency of branch states.

In actual implementation, in the present embodiment of the disclosure, before obtaining the first open circuit voltage corresponding to each of the branches, the detection method further includes:

collecting the total currents corresponding to the battery system;

confirming that each of the branches is currently in the off state if determining that the second open circuit voltages within a preset second time are less than a preset third voltage threshold and the total currents within the preset second time are less than a preset third current threshold.

Optionally, the step of confirming that each of the branches is currently in the off state if determining that the second open circuit voltages within the preset second time are less than the preset third voltage threshold and the total currents within the preset second time are less than the preset third current threshold may include:

calculating an average value of any consecutive N total currents and define the average value as a third average value;

determining whether the second open circuit voltages within the preset second time are all less than the preset third voltage threshold and whether absolute values of the third average values within the preset second time are less than the third current threshold;

if so, confirming that each of the branches is currently in the off state;

if not, confirming that the branches are not all currently in the off state, and continuing to obtain the first open circuit voltage corresponding to each of the branches and the second open circuit voltage.

Optionally, the step of confirming the third average value can be implemented in the following ways:

it is assumed that the total currents collected are marked as I1, I2, I3, I4, I5 and I6 in that sequence based on the collection order, and N is 3, for example.

In this case, the first third average value is denoted by Ia31, that is, $Ia31=(I1+I2+I3)/3$;

the second third average value is denoted by Ia32, that is, $Ia32=(I2+I3+I4)/3$;

the third and third average value is denoted by Ia33, that is, $Ia33=(I3+I4+I5)/3$;

similarly, the remaining third average values are calculated using the above method.

Here, the value of N is not limited to 3. 3 is only used as an example for description, and the value of N is not specifically limited here.

In addition, for the setting of the preset second time, it is necessary to satisfy that the preset second time is less than or equal to the maximum allowable diagnosis time of the battery system and the necessary fault filtering time to avoid affecting the battery system and ensure the accuracy of the detection results.

For the third voltage threshold:

first of all, a minimum total voltage of a battery system is defined (which can be denoted by Vmin), and its specific value can be: a sum of discharge cut-off voltages of the batteries included in each of the branches;

then, a size of the third voltage threshold is confirmed according to factors such as a collection accuracy of the second open circuit voltage and an external capacitance value of the battery system. The third voltage threshold is a threshold for determining whether all of the branches are in the off state. The third voltage threshold is less than the minimum total voltage (i.e., Vmin) of the battery system.

That is to say, if the second open circuit voltages collected within the preset second time are less than the third voltage threshold, it means that the second open circuit voltages corresponding to the battery system are very small and less than the minimum total voltage corresponding to the battery system. Therefore, at this time, it can be considered that the battery system does not output the second open circuit voltages to the outside. That is to say, since all of the branches are in the off state at the time, the battery system is unable to output the second open circuit voltages to the outside.

For the third current threshold: it can be the same as the aforementioned first current threshold, or it can be set to a different value to meet the needs of various application scenarios and improve the design flexibility.

One specific embodiment is provided below to explain how to determine whether each of the branches is currently in the off state.

It is assumed that, the preset second time is denoted by t2, the calculated third average values are sequentially denoted by Ia31, Ia32, Ia33, etc.; the collected second open circuit voltages are sequentially denoted by Vc1, Vc2, Vc3, etc.; 5 second open circuit voltages are collected and three third average values are calculated within T2.

In this case, whether the 5 second open circuit voltages are all less than the preset third voltage threshold and whether absolute values of the three third average values are all less than the third current threshold are determined;

if so, it means that the total currents corresponding to the battery system are smaller and relatively stable and the second open circuit voltages corresponding to the battery system are also smaller and relatively stable, so it can be confirmed that the branches are currently all in the off state;

if not, it means that the total currents corresponding to the battery system or the second open circuit voltages corresponding to the battery system fluctuate greatly, so it can be determined that the branches are not currently all in the off state but includes the branch in the (normal) on state. Accordingly, the first open circuit voltage and the second open circuit voltage may be collected next to determine the on/off state of each of the branches.

A specific embodiment is provided below to describe the detection method for branch states provided by the present embodiment of the disclosure.

Figure 3A:
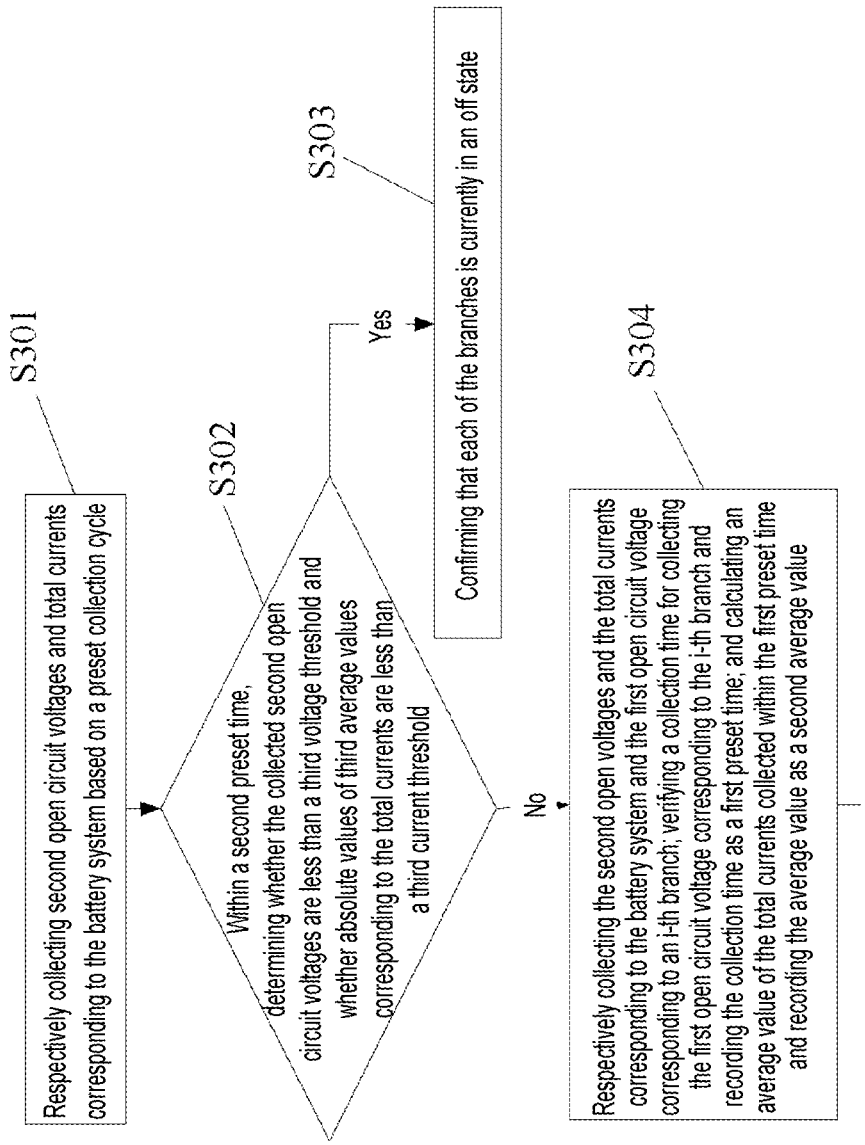
FIGS. 3A-3C is a flowchart of a specific embodiment provided in an embodiment of the disclosure.
Figure 3B:
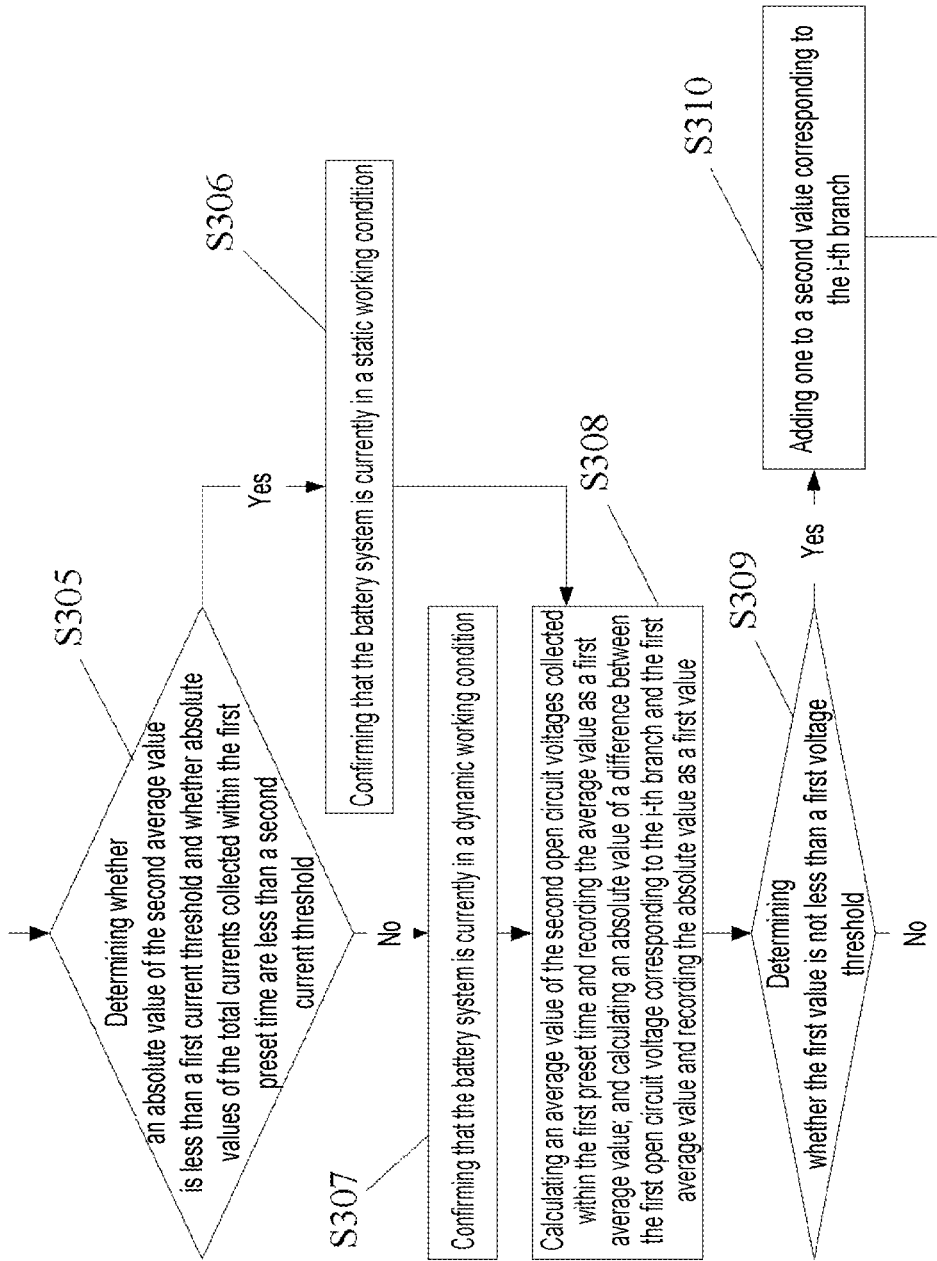
Figure 3C:
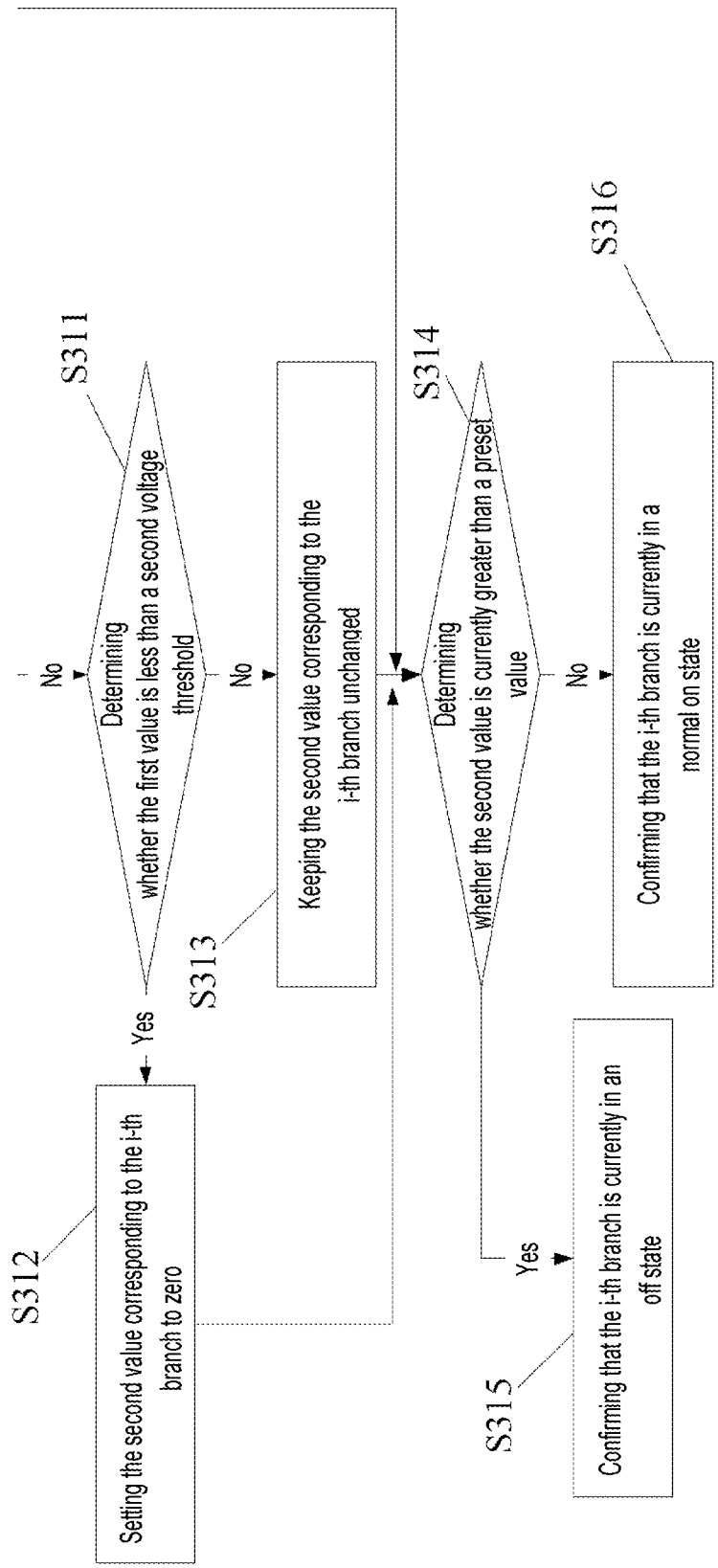

With reference to the flowchart shown in FIGS. 3A-3C, the i-th branch is taken here as an example.

S301: second open circuit voltages and total currents corresponding to a battery system are respectively collected based on a preset collection period.

Here, collection periods for collecting the second open circuit voltages and the total currents may be set to be the same or different.

S302: within a preset second time, whether the collected second open circuit voltages are less than a third voltage threshold and whether absolute values of third average values corresponding to the total currents are less than a third current threshold are determined; if so, S303 is executed; if not, S304 is executed.

For the third average values corresponding to the total currents, each of the third average values can be understood as: an average value of consecutive N total currents collected.

S303: it is confirmed that each of the branches is in an off state.

S304: the second open voltages and the total currents corresponding to the battery system and the first open circuit voltage corresponding to an i-th branch are respectively collected; a collection time for collecting the first open circuit voltage corresponding to the i-th branch is confirmed and recorded as a preset first time; an average value of the total currents collected within the preset first time is calculated and recorded as a second average value.

S305: whether the second average value is less than a preset first current threshold and whether the total currents collected are less than a preset second current threshold are determined; if so, S306 is executed; if not, S307 is executed.

S306: it is confirmed that the battery system is currently in a static working condition; S308 is executed.

S307: it is confirmed that the battery system is currently in a dynamic working condition.

S308: an average value of the second open circuit voltages collected within the preset first time is calculated and recorded as a first average value; and an absolute value of a difference between the first open circuit voltage corresponding to the i-th branch and the first average value is calculated and recorded as a first value.

S309: whether the first value is not less than the first voltage threshold is determined; if so, S310 is executed; if not, S311 is executed.

Here, the first voltage thresholds corresponding to the static working condition and the dynamic working condition are different.

S310, a second value corresponding to the i-th branch is added by 1; S314 is executed.

S311: whether the first value is less than a second voltage threshold is determined; if so, S312 is executed; if not, S313 is executed.

Here, the second voltage thresholds corresponding to the static working condition and the dynamic working condition are different.

S312: the second value corresponding to the i-th branch is set to zero; S314 is executed.

S313: the second value corresponding to the i-th branch is kept unchanged.

S314: whether the second value is currently greater than a preset value is determined; if so, S315 is executed; if not, S316 is executed.

Here, an initial value of the second value may be set to 0.

S315: it is confirmed that the i-th branch is currently in an off state.

S316: it is confirmed that the i-th branch is currently in a normal on state.

The above steps S304 to S316 are used to complete one determination of the on/off state of the i-th branch Then, when the detection period is reached, the steps S304 to S316 are executed again to perform the next determination. The determination is performed continuously to detect the on/off state of each branch in real time, so as to obtain an operating state of the battery system.

Based on the same inventive concept, an embodiment of the present disclosure provides a detection device for branch states of a battery system. The implementation principle of the detection device is similar to the implementation principle of the aforementioned detection method. For a specific embodiment of the detection device, reference may be made to the foregoing embodiments of the detection method, and repeated descriptions are not repeated.

Figure 4:
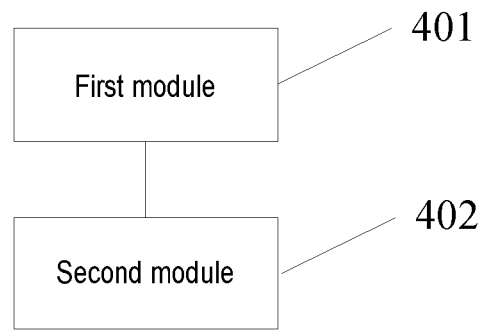
FIG. 4 is a schematic structural diagram of a detection device provided in an embodiment of the disclosure.

Specifically, the present embodiment of the disclosure provides a detection device for branch states of a battery system. The battery system includes a plurality of branches connected in parallel. Each of the branches includes at least one battery. The structure of the battery system can be seen in FIG. 2; the detection device is as shown in FIG. 4 and may include:

a first module 401, configured to obtain a first open circuit voltage corresponding to each of the branches and a second open circuit voltage corresponding to the battery system;

a second module 402, configured to judge a current on/off state of each corresponding branch according to the first open circuit voltage and the second open circuit voltage.

Optionally, in the present embodiment of the disclosure, the second module 402 is specifically configured for:

for each of the branches, executing a process of:

judging the current on/off state of the corresponding branch according to a calculated difference between the first open circuit voltage of the corresponding branch and the second open circuit voltage.

Optionally, in the present embodiment of the disclosure, the second module 402 is specifically configured for:

calculating an average value of the second open circuit voltages collected within a preset first time, and defining the average value as a first average value;

calculating a difference between the first open circuit voltage of the corresponding branch and the first average value, and defining the difference as a first value;

adjusting a second value for indicating a branch on/off state of the corresponding branch according to the first value;

judging the current on/off state of the corresponding branch according to the second value.

Optionally, in the present embodiment of the disclosure, the second module 402 is specifically configured for:

confirming that the corresponding branch is currently in the off state when determining that the second value is greater than a preset value.

Optionally, in the present embodiment of the disclosure, the second module 402 is specifically configured for:

adding one to the second value of the corresponding branch when determining that the first value is not less than a preset first voltage threshold;

or keeping the second value of the corresponding branch unchanged when determining that the first value is less than the preset first voltage threshold and the first value is not less than a preset second voltage threshold, wherein the first voltage value is greater than the second voltage threshold;

or setting the second value of the corresponding branch to zero when determining that the first value is less than the preset second voltage threshold.

Figure 5:
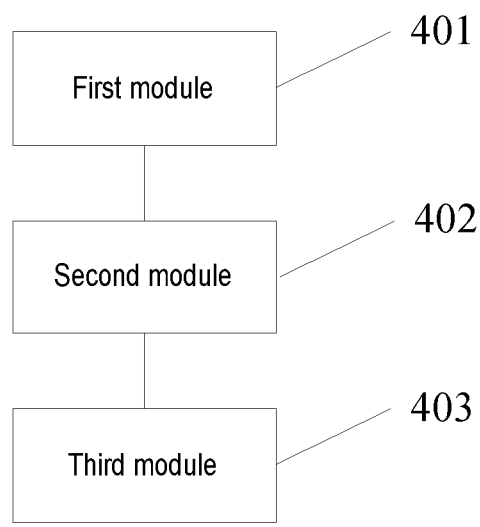
FIG. 5 is a schematic structural diagram of another detection device provided in an embodiment of the disclosure.

Optionally, in the present embodiment of the disclosure, as shown in FIG. 5, the detection device further includes a third module 403.

Here, the first module 401 is further configured for:

when a working condition state that the battery system is in includes a static working condition and a dynamic working condition, before judging the current on/off state of the corresponding branch according to the first open circuit voltage and the second open circuit voltage and after obtaining the first open circuit voltage corresponding to each of the branches and the second open circuit voltage corresponding to the battery system, confirming total currents corresponding to the battery system collected within the preset first time;

the third module 403 is configured for judging the working condition state that the battery system is currently in according to the total currents.

Optionally, in the present embodiment of the disclosure, the third module 403 is specifically configured for:

calculating an average value of the total currents collected within the preset first time, and defining the average value as a second average value;

judging the working condition state that the battery system is currently in according to the second average value and the total currents.

Optionally, in the present embodiment of the disclosure, the third module 403 is specifically configured for:

determining whether the second average value is less than a preset first current threshold and whether the total currents collected are less than a preset second current threshold;

if so, confirming that the battery system is currently in the static working condition;

if not, confirming that the battery system is currently in the dynamic working condition.

Optionally, in the present embodiment of the disclosure, the first module 401 is further configured for:

before obtaining the first open circuit voltage corresponding to each of the branches, collecting the total currents corresponding to the battery system;

The third module 403 is further configured for:

confirming that each of the branches is currently in the off state if determining that the second open circuit voltages within a preset second time are less than a preset third voltage threshold and the total currents within the preset second time are less than a preset third current threshold.

Figure 6:
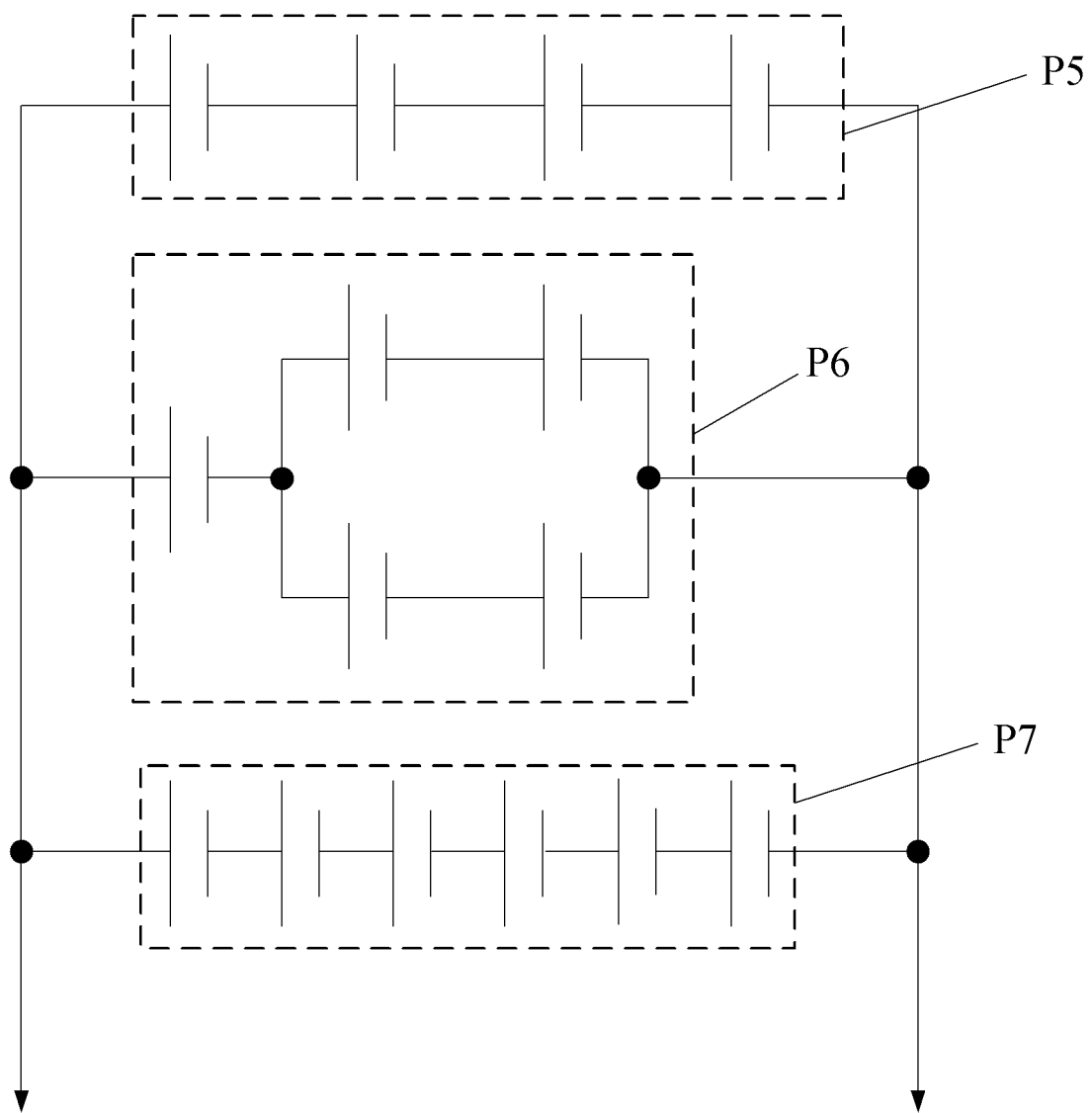
FIG. 6 is a schematic structural diagram of another battery system provided in an embodiment of the disclosure.

Based on the same inventive concept, an embodiment of the present disclosure provides a battery system including a plurality of branches connect in parallel (e.g., P5, P6 and P7) as shown in FIG. 2 and FIG. 6.

Here, on/off states of the braches are detected by adopting the detection method provided in the foregoing embodiments of the disclosure.

Optionally, each of the branches includes at least one battery. A connection relationship between the batteries included in each of the branches and a setting method of the batteries among the branches are not specifically limited, and can be set according to actual needs.

Naturally, in addition to the three branches shown in FIG. 6, the battery system may also include other structures, which can be set according to specific needs and are not limited herein.

The beneficial effects of the above technical solutions are as follows.

In the detection method and the detection device for branch states of the battery system provided according to the embodiments of the disclosure, the current on/off state of each corresponding branch is judged according to the first open circuit voltage of the corresponding branch and the second open circuit voltage corresponding to the battery system. It can ensure that other non-faulty branches are not damaged, and can ensure the safety of the battery system to eliminate potential safety hazards.

Moreover, the detection method provided according to the embodiments of the disclosure is simple and quick to operate, and the detection method will not cause the complexity to increase rapidly as the number of branches increases. Therefore, the detection method provided according to the embodiments of the disclosure has good feasibility and practicability, and has a wide range of applications.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A detection method for branch states of a battery system, the battery system comprising a plurality of branches connected in parallel, each of the plurality of branches comprising at least one battery, the detection method comprising:
- obtaining a first open circuit voltage corresponding to each of the plurality of branches and a second open circuit voltage corresponding to the battery system;
- judging a current on/off state of each corresponding branch according to the first open circuit voltage and the second open circuit voltage, wherein for each of the plurality of branches, following process is executed:
  - calculating an average value of second open circuit voltages collected within a preset first time, and defining the average value as a first average value;
  - calculating a difference between the first open circuit voltage of the corresponding branch and the first average value, and defining the difference as a first value;
  - adjusting a second value for indicating a branch on/off state of the corresponding branch according to the first value; and
  - judging the current on/off state of the corresponding branch according to the second value.

2. The detection method according to claim 1, wherein the step of judging the current on/off state of the corresponding branch according to the second value comprises:
- judging that the corresponding branch is currently in an off state when determining that the second value is greater than a preset value.

3. A battery system, comprising a plurality of branches connected in parallel, wherein on/off states of the plurality of branches are detected by adopting the detection method according to claim 2.

4. The detection method according to claim 1, wherein the step of adjusting the second value for indicating the branch on/off state of the corresponding branch according to the first value comprises:
- adding one to the second value of the corresponding branch when determining that the first value is not less than a preset first voltage threshold;
- or keeping the second value of the corresponding branch unchanged when determining that the first value is less than the preset first voltage threshold and the first value is not less than a preset second voltage threshold, wherein the first voltage value is greater than the second voltage threshold;
- or setting the second value of the corresponding branch to zero when determining that the first value is less than the preset second voltage threshold.

5. The detection method according to claim 4, wherein a working condition state that the battery system is in includes a static working condition and a dynamic working condition;
- the first voltage threshold corresponding to the battery system in the static working condition is less than the first voltage threshold corresponding to the battery system in the dynamic working condition;
- the second voltage threshold corresponding to the battery system in the static working condition is less than the second voltage threshold corresponding to the battery system in the dynamic working condition;
- the second voltage threshold corresponding to the battery system in the dynamic working condition is greater than the first voltage threshold corresponding to the battery system in the static working condition.

6. A battery system, comprising a plurality of branches connected in parallel, wherein on/off states of the plurality of branches are detected by adopting the detection method according to claim 4.

7. A battery system, comprising a plurality of branches connected in parallel, wherein on/off states of the plurality of branches are detected by adopting the detection method according to claim 5.

8. The detection method according to claim 1, wherein when a working condition state that the battery system is in includes a static working condition and a dynamic working condition, before judging the current on/off state of the corresponding branch according to the first open circuit voltage and the second open circuit voltage and after obtaining the first open circuit voltage corresponding to each of the plurality of branches and the second open circuit voltage corresponding to the battery system, the detection method further comprises:
- obtaining total currents corresponding to the battery system collected within a preset first time;
- judging the working condition state that the battery system is currently in according to the total currents.

9. The detection method according to claim 8, wherein the step of judging the working condition state that the battery system is currently in according to the total currents comprises:
- calculating an average value of the total currents collected within the preset first time, and defining the average value as a second average value;
- judging the working condition state that the battery system is currently in according to the second average value and the total currents.

10. The detection method according to claim 9, wherein the step of judging the working condition state that the battery system is currently in according to the second average value and the total currents comprises:
- determining whether the second average value is less than a preset first current threshold and whether the total currents collected are less than a preset second current threshold;
- if so, judging that the battery system is currently in the static working condition;
- if not, confirming that the battery system is currently in the dynamic working condition.

11. A battery system, comprising a plurality of branches connected in parallel, wherein on/off states of the plurality of branches are detected by adopting the detection method according to claim 8.

12. A battery system, comprising a plurality of branches connected in parallel, wherein on/off states of the plurality of branches are detected by adopting the detection method according to claim 9.

13. A battery system, comprising a plurality of branches connected in parallel, wherein on/off states of the plurality of branches are detected by adopting the detection method according to claim 10.

14. The detection method according to claim 1, wherein before obtaining the first open circuit voltage corresponding to each of the plurality of branches, the detection method further comprises:
- collecting total currents corresponding to the battery system;
- judging that each of the plurality of branches is currently in an off state if determining that second open circuit voltages within a preset second time are less than a preset third voltage threshold and the total currents within the preset second time are less than a preset third current threshold.

15. A battery system, comprising a plurality of branches connected in parallel, wherein on/off states of the plurality of branches are detected by adopting the detection method according to claim 1.

16. A detection device for branch states of a battery system, the battery system comprising a plurality of branches connected in parallel, each of the plurality of branches comprising at least one battery, the detection device comprising:
- a first module, configured to obtain a first open circuit voltage corresponding to each of the plurality of branches and a second open circuit voltage corresponding to the battery system;
- a second module, configured to judge a current on/off state of each corresponding branch according to the first open circuit voltage and the second open circuit voltage, wherein for each of the plurality of branches, the second module is configured to:
  - calculate an average value of second open circuit voltages collected within a preset first time, and define the average value as a first average value;
  - calculate a difference between the first open circuit voltage of the corresponding branch and the first average value, and define the difference as a first value;
  - adjust a second value for indicating a branch on/off state of the corresponding branch according to the first value; and
  - judge the current on/off state of the corresponding branch according to the second value.

17. A detection method for branch states of a battery system, the battery system comprising a plurality of branches connected in parallel, each of the plurality of branches comprising at least one battery, the detection method comprising:
- obtaining a first open circuit voltage corresponding to each of the plurality of branches and a second open circuit voltage corresponding to the battery system;
- judging a current on/off state of each corresponding branch according to the first open circuit voltage and the second open circuit voltage; and
- before obtaining the first open circuit voltage corresponding to each of the plurality of branches, the detection method further comprises:
- collecting total currents corresponding to the battery system;
- judging that each of the plurality of branches is currently in an off state if determining that second open circuit voltages within a preset second time are less than a preset third voltage threshold and the total currents within the preset second time are less than a preset third current threshold.

18. A detection device for branch states of a battery system, the battery system comprising a plurality of branches connected in parallel, each of the plurality of branches comprising at least one battery, the detection device comprising:
- a first module, configured to obtain a first open circuit voltage corresponding to each of the plurality of branches and a second open circuit voltage corresponding to the battery system;
- a second module, configured to judge a current on/off state of each corresponding branch according to the first open circuit voltage and the second open circuit voltage; wherein
- before obtaining the first open circuit voltage corresponding to each of the plurality of branches, the first module is configured to collecting total currents corresponding to the battery system; and
- the detection device further comprises a third module configured to judge that each of the plurality of branches is currently in an off state if determining that second open circuit voltages within a preset second time are less than a preset third voltage threshold and the total currents within the preset second time are less than a preset third current threshold.

* * * * *